United States Patent
Jeon et al.

(10) Patent No.: US 10,163,870 B2
(45) Date of Patent: Dec. 25, 2018

(54) LIGHT EMITTING DEVICE PACKAGE AND LIGHT EMITTING DEVICE PACKAGE MODULE

(71) Applicant: LUMENS CO., LTD., Yongin-si, Gyeonggi-do (KR)

(72) Inventors: Hyo Gu Jeon, Yongin-si (KR); Jung Hyun Park, Yongin-si (KR); Dae Gil Jung, Yongin-si (KR); Seung Hyun Oh, Yongin-si (KR); Yun Geon Cho, Yongin-si (KR); Bo Gyun Kim, Yongin-si (KR); Suk Min Han, Yongin-si (KR); Jun Hyeok Han, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/815,667

(22) Filed: Nov. 16, 2017

(65) Prior Publication Data

US 2018/0076183 A1 Mar. 15, 2018

Related U.S. Application Data

(63) Continuation of application No. 15/169,217, filed on May 31, 2016, now Pat. No. 9,853,017.

(30) Foreign Application Priority Data

Jun. 5, 2015 (KR) .................. 10-2015-0079891
Dec. 24, 2015 (KR) .................. 10-2015-0185945

(51) Int. Cl.
*H01L 33/62* (2010.01)
*H01L 25/075* (2006.01)
(Continued)

(52) U.S. Cl.
CPC ........ *H01L 25/0753* (2013.01); *H01L 33/504* (2013.01); *H01L 33/486* (2013.01); *H01L 33/62* (2013.01); *H01L 2224/16245* (2013.01)

(58) Field of Classification Search
CPC ..... H01L 33/48; H01L 33/483; H01L 33/486; H01L 33/387; H01L 33/62; H01L 33/64
See application file for complete search history.

(56) References Cited

U.S. PATENT DOCUMENTS 9,171,882 B2 * 10/2015 Akimoto .............. H01L 27/156

* cited by examiner

*Primary Examiner* — Steven Loke
*Assistant Examiner* — Scott Stowe
(74) *Attorney, Agent, or Firm* — Mei & Mark LLP

(57) ABSTRACT

Disclosed herein is a light emitting device package and a light emitting device package module. The light emitting device package includes: a base including a cavity; a first light emitting device disposed in the cavity, the first light emitting device including a first light emitting element configured to produce light having a first peak wavelength and a first fluorescent layer covering a top and side surfaces of the first light emitting element; and a second light emitting device disposed in the cavity, the second light emitting device including a second light emitting element configured to produce light having a second peak wavelength and a second fluorescent layer covering a top and side surfaces of the second light emitting element, wherein the first fluorescent layer is configured to convert the light having the first peak wavelength of the first light emitting element to light having a third peak wavelength, and the second fluorescent layer is configured to convert the light having the second peak wavelength of the second light emitting element to light having a fourth peak wavelength.

15 Claims, 9 Drawing Sheets

(51) Int. Cl.
*H01L 33/50* (2010.01)
*H01L 33/48* (2010.01)

LIGHT EMITTING DEVICE PACKAGE AND LIGHT EMITTING DEVICE PACKAGE MODULE

CROSS-REFERENCE TO RELATED APPLICATIONS

This application is a continuation of application Ser. No. 15/169,217, filed May 31, 2016, which claims priority to Korean Patent Applications No. 10-2015-0079891, filed on Jun. 5, 2015, and No. 10-2015-0185945, filed on Dec. 24, 2015, the contents of which are incorporated herein by reference in their entirety.

BACKGROUND

Field

The present invention relates to a light emitting device package and a light emitting device package module including the same.

Description of the Related Art

Recently, a light emitting device has been used as a backlight unit in a display such as laptop computer, a monitor, a cellular phone, a television (TV), or the like, or a white light source used for illumination, or the like. Therefore, various attempts to obtain white light using the light emitting device have been conducted. For example, a method of using a combination of a blue light emitting device and a yellow fluorescent layer, combining a blue light emitting device, a red fluorescent layer, and a green fluorescent layer with each other, or the like, has been utilized. However, in a white light implementing scheme that is generally used, a problem such as an increase in power consumption due to a decrease in color reproducibility or a decrease in luminous intensity caused by a limitation in an amount of added fluorescent layer has occurred.

Therefore, there is a case of using an organic light emitting diode (OLED) having excellent color reproducibility. However, also in this case, there is a problem that a high cost is required. Therefore, a scheme capable of implementing color reproducibility of white light and being economically efficient has been significantly demanded in the related art.

SUMMARY

The present invention has been invented in order to solve the object described above, and an object of the present invention is to provide a light emitting device package having excellent color reproducibility and high economical efficiency, and a light emitting device package module including the same.

According to an exemplary embodiment of the present invention, a light emitting device package may include: a base including a cavity; a first light emitting device disposed in the cavity, the first light emitting device including a first light emitting element configured to produce light having a first peak wavelength and a first fluorescent layer covering a top and side surfaces of the first light emitting element; and a second light emitting device disposed in the cavity, the second light emitting device including a second light emitting element configured to produce light having a second peak wavelength and a second fluorescent layer covering a top and side surfaces of the second light emitting element, wherein the first fluorescent layer is configured to convert the light having the first peak wavelength of the first light emitting element to light having a third peak wavelength, and the second fluorescent layer is configured to convert the light having the second peak wavelength of the second light emitting element to light having a fourth peak wavelength.

The light emitting device package may further comprise a molding member configured to fill the cavity and being disposed on the first light emitting device and the second light emitting device, the molding member separating the first light emitting device and the second light emitting device.

The first light emitting device and the second light emitting device each may comprise a flip-chip type light emitting diode (LED).

The first fluorescent layer or the second fluorescent layer may comprise at least one of yttrium aluminum garnet (YAG), terbium aluminum garnet (TAG), lutetium aluminum garnet (LuAG), silicate, nitride, oxynitride, and sulfide.

The first light emitting element may comprise a first blue light emitting diode (LED) configured to emit the light having the first peak wavelength in a range of about 380 nm and about 450 nm, and the first fluorescent layer may be configured to convert the light having the first peak wavelength to light having the third peak wavelength in a range of about 510 nm and about 550 nm.

The second light emitting element may comprise a second blue light emitting diode (LED) configured to emit the light having the second peak wavelength in a range of about 380 nm and about 450 nm, and the second fluorescent layer may be configured to convert the light having the second peak wavelength to the light having the fourth peak wavelength in a range of about 600 nm and about 650 nm.

The base may further include a plurality of reflecting surfaces configured to reflect light from the first light emitting device and the second light emitting device towards a center of the cavity.

The light emitting device package may further comprise a terminal for power supply.

The molding member may comprise a plurality of profiles at edges of the molding member.

According to another exemplary embodiment of the present invention, a light emitting device package module includes: a circuit board; and a plurality of light emitting device packages coupled to the circuit board, wherein each of the plurality of light emitting device packages comprises: a base including a cavity; a first light emitting device disposed in the cavity, the first light emitting device including a first light emitting element configured to produce light having a first peak wavelength and a first fluorescent layer covering a top and side surfaces of the first light emitting element; and a second light emitting device disposed in the cavity, the second light emitting device including a second light emitting element configured to produce light having a second peak wavelength and a second fluorescent layer covering a top and side surfaces of the second light emitting element, wherein the first fluorescent layer is configured to convert the light having the first peak wavelength of the first light emitting element to light having a third peak wavelength, and the second fluorescent layer is configured to convert the light having the second peak wavelength of the second light emitting element to light having a fourth peak wavelength.

The light emitting device package module may further comprise a reflective sheet; and a light guide plate disposed on the reflective sheet.

According to still another exemplary embodiment of the present invention, a light emitting device package may include: a substrate including a first electrode, a second electrode, and an electrode separation portion disposed between the first electrode and the second electrode; a first light emitting device including a first pad and a second pad, the first pad being electrically coupled to the first electrode of the substrate; a second light emitting device including a third pad and a fourth pad, the fourth pad being electrically coupled to the second electrode of the substrate; and a pad connecting member, the pad connecting member being disposed on the substrate and configured to electrically couple the second pad of the first light emitting device and the third pad of the second light emitting device, wherein the substrate is configured to electrically couple the first light emitting device and the second light emitting device in series via the pad connecting member.

The first light emitting device and the second light emitting device each may comprise a flip-chip type light emitting diode (LED).

The pad connecting member may be disposed on an insulating member disposed between the pad connecting member and the substrate.

The light emitting device package may further include: a first conductive bonding material disposed between the first electrode of the substrate and the first pad of the first light emitting device; and a second conductive bonding material disposed between the second electrode of the substrate and the fourth pad of the second light emitting device.

The pad connecting member may comprise a conductive bonding material.

The pad connecting member may be disposed on the electrode separation portion of the substrate.

The pad connecting member may be disposed in a receptacle hole on the electrode separation portion of the substrate.

The light emitting device package may further comprise an adhesive layer disposed between the pad connecting member and the electrode separation portion of the substrate.

The electrode separation portion of the substrate may be disposed to separate the first electrode and the second electrode, and portions of the electrode separation portion of the substrate may be disposed on portions of the first electrode and the second electrode.

DETAILED DESCRIPTION

Figure 1:
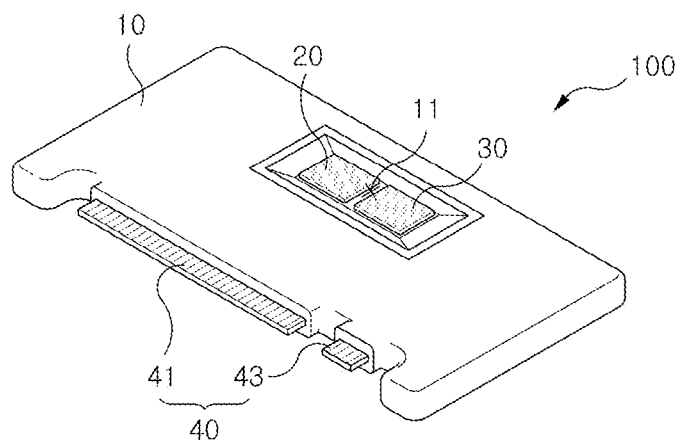
FIG. 1 is a perspective view of a light emitting device package according to an exemplary embodiment of the present invention.

Hereinafter, light emitting device packages and light emitting device package modules including the same according to exemplary embodiments of the present invention will be described in detail with reference to the accompanying drawings. Throughout the present disclosure, components that are the same as or similar to each other will be denoted by reference numerals that are the same as or similar to each other and a description therefor will be replaced by the first description, in different exemplary embodiments.

Figure 2:
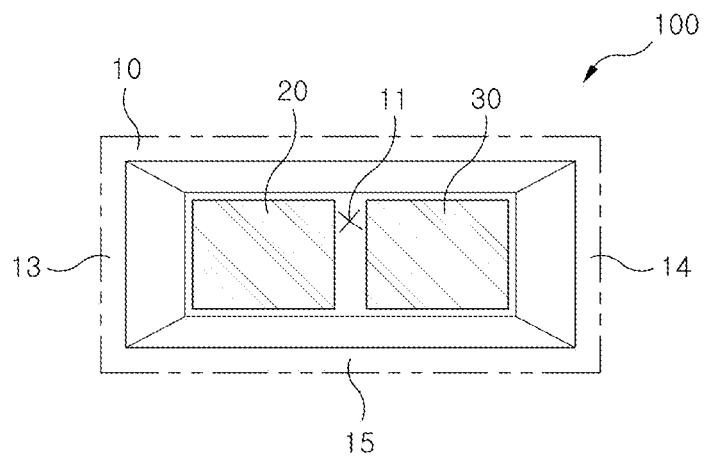
FIG. 2 is a plan view of the light emitting device package illustrated in FIG. 1.
Figure 3:
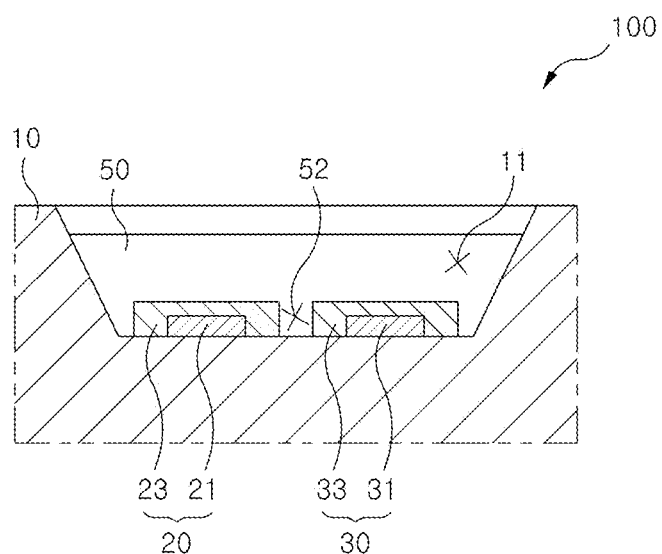
FIG. 3 is a cross-sectional view of the light emitting device package illustrated in FIG. 1.

FIG. 1 is a perspective view of a light emitting device package 100 according to an exemplary embodiment of the present invention, FIG. 2 is a plan view of the light emitting device package 100 illustrated in FIG. 1, and FIG. 3 is a cross-sectional view of the light emitting device package 100 illustrated in FIG. 1.

As illustrated in FIGS. 1 to 3, the light emitting device package 100 according to an exemplary embodiment of the present invention, which has a twin package structure, may be configured to include a base 10, a first light emitting device 20, a second light emitting device 30, a terminal 40 for power supply, and a molding member 50 protecting the first light emitting device 20 and the second light emitting device 30.

The base 10 has a general shape of the light emitting device package 100, and a cavity 11 for mounting the first light emitting device 20 and the second light emitting device 30 is formed in a main surface of the base 10. The base 10 may be provided as a substrate, be molded using a resin material that is opaque or has large reflectivity, and be provided using a polymer resin on which an injection-molding process is easily performed. However, the base is not limited thereto, but may be molded using various resin materials. For example, the base may be made of a non-conductive material such as ceramic. In addition, wiring patterns may be formed on an upper surface of the cavity 11 of the base 10.

Meanwhile, the cavity 11 is formed in the main surface of the base 10. Reflecting surfaces may be formed on side surfaces of the cavity 11 so as to more efficiently irradiate emitted light of the light emitting devices 20 and 30 mounted on the base 10. In other words, in the present invention, a plurality of reflecting surfaces 13 to 15 are formed on the base 10 and reflect first light and second light each irradiated from the first light emitting device 20 and the second light emitting device 20, thereby making it possible to allow the first light and the second light to be irradiated toward a center of the cavity 11. These reflecting surfaces may include a first reflecting surface 13 formed adjacently to the first light emitting device 20 and reflecting the first light, a second reflecting surface 14 formed adjacently to the second light emitting device 30 and reflecting the second light, and a third reflecting surface 15 formed between the first light emitting device 20 and the second light emitting device 30 and reflecting both of the first light and the second light.

The first light emitting device 20 and the second light emitting device 30 mounted in the cavity 11 are disposed to have a predetermined interval therebetween in a scheme in which an intermediate wall is not present therebetween by a molding spacing portion 52. The reason is that the first light emitting device 20 and the second light emitting device 30 are mounted in a state in which they include fluorescent layers without needing to apply separate fluorescent layers to the first light emitting device 20 and the second light emitting device 30. That is, the first light emitting device 20 and the second light emitting device 30 may include light emitting elements 21 and 31 and fluorescent layers 23 and 33 covering the light emitting elements 21 and 31, respectively. These light emitting devices 20 and 30 may be a chip scale package (CSP) or a wafer level package (WLP).

The chip scale package, which is a light emitting device package formed in a chip scale unit, is configured by mounting a large number of light emitting elements on a substrate strip, applying a fluorescent layer en bloc, and performing a singulation process. Here, the chip scale package has a size that is substantially the same as that of the light emitting element or is slightly larger than that of the light emitting element within a range of 20%. This package does not require an additional sub-mount or substrate, such that it may be directly connected to a board. In addition, this package has a size smaller than that of an existing light emitting device package, is manufactured at a cost cheaper than a cost required for manufacturing the existing light emitting device package, and has thermal resistance capability and color uniformity higher than those of the existing light emitting device package.

As the light emitting elements 21 and 31, which are photoelectric elements emitting light at the time of applying an electrical signal thereto, a semiconductor light emitting element in which a semiconductor layer is epitaxially grown on a growth substrate may be used. The growth substrate may be a sapphire substrate, but is not limited thereto. For example, the known growth substrate such as a spinel substrate, a SiC substrate, a GaN substrate, a GaAs substrate, or the like, may be used. In detail, the light emitting element may include an n-type semiconductor layer, a p-type semiconductor layer, and a light emitting layer disposed between the n-type semiconductor layer and the p-type semiconductor layer. Here, the semiconductor layers may be made of BN, SiC, ZnSe, GaN, InGaN, InAlGaN, AlGaN, BAlGaN, BInAlGaN, or the like. The light emitting elements 21 and 31 may be a blue luminous body in consideration of a light output, and light emitting layers of the blue light emitting elements 21 and 31 may be formed of a nitride semiconductor made of InxAlyGa1-x-yN ($0 \leq x \leq 1$, $0 \leq y \leq 1$, $x+y \leq 1$), and may be formed in a single or multi quantum well structure to improve light output.

The fluorescent layers 23 and 33 may contain any one of yttrium aluminum garnet (YAG), terbium aluminum garnet (TAG), lutetium aluminum garnet (LuAG), silicate, nitride, oxynitride, and sulfide, or a combination thereof.

As described above, in the chip scale package, which is the light emitting device package having a size that is substantially the same as that of a chip, the light emitting elements 21 and 31 and the fluorescent layers 23 and 33 each enclosing the light emitting elements 21 and 31 are formed at a chip size. In more detail, as illustrated in FIG. 3, the first light emitting device 20 may include a first light emitting element 21 and a first fluorescent layer 23 formed on a top and side surfaces of the first light emitting element 21 and allowing first light having a first wavelength region to be irradiated, and the second light emitting device 30 may include a second light emitting element 31 and a second fluorescent layer 33 formed on a top and side surfaces of the second light emitting element 31 and allowing second light having a second wavelength region to be irradiated. Here, the first fluorescent layer 23 and the second fluorescent layer 33 may emit green light and red light, respectively. The first light emitting device 20 may be a green chip scale package, and the second light emitting device 30 may be a red chip scale package. Light output characteristics depending on the above-mentioned configuration will be described below in more detail with reference to FIG. 4.

As described above, in the case of using the chip scale package, the first light emitting device 20 and the second light emitting device 30 are disposed to be spaced apart from each other by the molding spacing portion 52 without using the intermediate wall, which is a structure for separately applying the fluorescent layers 23 and 33. In other words, the molding spacing portion 52 may be formed to directly contact opposite side surfaces (facing surfaces) of the first fluorescent layer 23 and the second fluorescent layer 33. Therefore, a distance between two light emitting devices may be minimized. Therefore, a flooding phenomenon that may occur when a distance between devices is distant may be structurally prevented.

The terminal 40 for power supply is a component for receiving power supplied from a circuit board of a light emitting device package module. Since the terminal 40 for power supply protrudes from a side surface of the base 10 as illustrated, in the case in which the light emitting device package 100 is disposed on the circuit board, the light emitting device package 100 vertically stands. A configuration for this will be described below with reference to FIGS. 7 and 8. In addition, the terminal 40 for power supply may include an anode terminal portion 41 and a cathode terminal portion 43 formed in parallel with each other on the same side surface of the base.

Meanwhile, the molding member 50 for protecting the first light emitting device 20 and the second light emitting device 30 may be further formed. The molding member 50 is made of a transparent resin material to serve to protect the first light emitting device 20 and the second light emitting device 30. Meanwhile, an extension formed portion 51 (see FIG. 9) is formed in a sealing portion of the molding member 50 to elongate a moisture penetration path, thereby making it possible to prevent the molding member 50 from being peeled off by moisture. This will be described below with reference to FIG. 9.

Hereinafter, light characteristics of the light emitting device package module 100 described with reference to FIGS. 1 to 3 will be described with reference to FIGS. 4 to 6.

Figure 4:
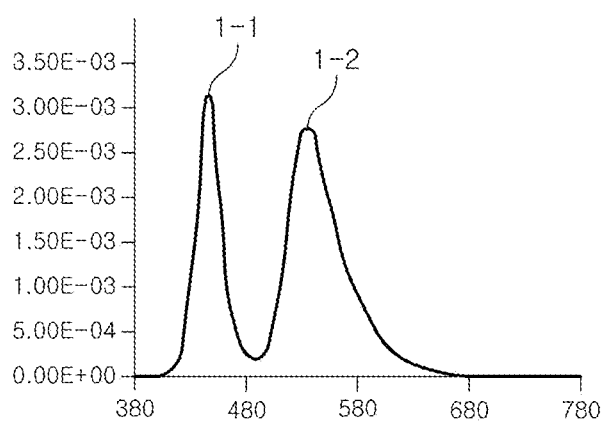
FIG. 4 is a graph illustrating light characteristics of a first light emitting device in a light emitting device package module according to an exemplary embodiment of the present invention.

FIG. 4 is a graph illustrating light characteristics of the first light emitting device package 20, which is the green chip scale package. The first light emitting element 21, which is a luminous body of the first light emitting device 20, is a blue light emitting diode (LED) and has a first peak wavelength of 380 to 450 nm (a blue light region), and a fluorescent material of the first fluorescent layer 23 serves to convert a peak wavelength band of irradiated light from the first light emitting element 21 into 510 to 550 nm (a red light region)(third peak wavelength). Therefore, a graph illustrating light characteristic of the first light emitting device 20 has two peak regions, as illustrated in FIG. 4. That is, peak regions appear in a blue light region 1-1 (a light emitting wavelength region), which is a peak region of the first light emitting element 21, which is the luminous body, and a green light region 1-2 (a first wavelength region), which is a peak region of light converted by the fluorescent material of the first fluorescent layer 23.

Figure 5:
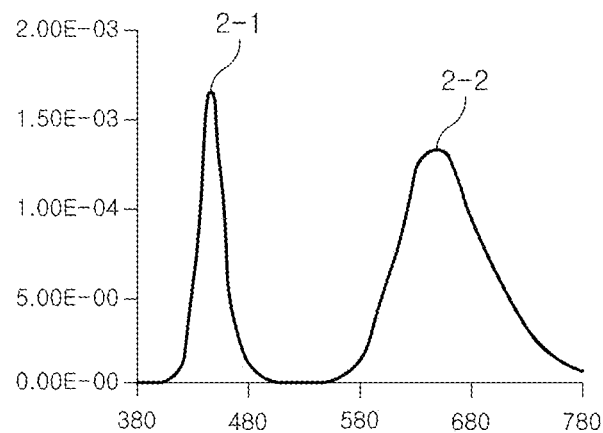
FIG. 5 is a graph illustrating light characteristics of a second light emitting device in the light emitting device package module according to an exemplary embodiment of the present invention.

FIG. 5 is a graph illustrating light characteristics of the second light emitting device 30, which is the red chip scale package. The second light emitting element 31, which is a luminous body of the second light emitting device 30, is a blue LED and has a second peak wavelength of 380 to 450 nm (a blue light region), and a fluorescent material of the second fluorescent layer 33 serves to convert a peak wavelength band of irradiated light from the second light emitting element 31 into 600 to 650 nm (a red light region)(fourth peak wavelength). Therefore, a graph illustrating light characteristic of the second light emitting device 30 has two peak regions, as illustrated in FIG. 5. That is, peak regions appear in a blue light region 2-1 (a light emitting wavelength region), which is a peak region of the second light emitting element 31, which is the luminous body, and a red light region 2-2 (a second wavelength region), which is a peak region of light converted by the fluorescent material of the second fluorescent layer.

Figure 6:
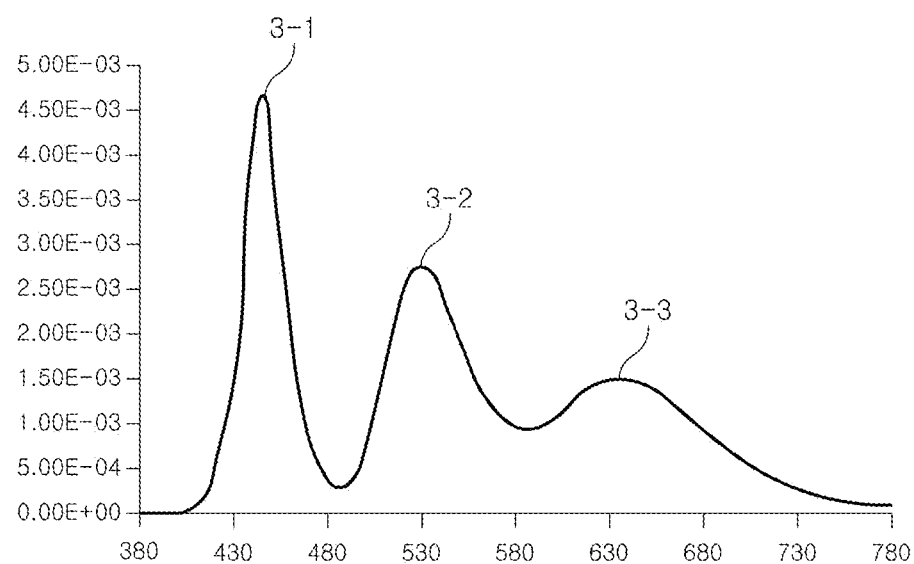
FIG. 6 is a graph illustrating light characteristics of a light emitting device module according to an exemplary embodiment of the present invention.

FIG. 6 is a graph illustrating light characteristics of the light emitting device package 100 including the first light emitting device 20 and the second light emitting device 30. Light characteristics of the light emitting device package 100 are the same as the sum of light characteristics of the first light emitting device 20 and the second light emitting device 30. That is, a graph illustrating light characteristic of the light emitting device package 100 has three peak regions, as illustrated in FIG. 6. That is, peak regions appear in a blue light region 3-1, which is a peak region of blue LEDs, which are the luminous bodies of the first and second light emitting devices 20 and 30, a green light region 3-2, which is a peak region of light converted by the fluorescent material of the first fluorescent layer 23 of the first light emitting device 20, and a red light region 3-3, which is a peak region of light converted by the fluorescent material of the second fluorescent layer 33 of the second light emitting device 30. In the light emitting device package according to an exemplary embodiment of the present invention emitting irradiated light having all of three primary color peak region bands, color reproducibility may be improved.

Figure 7:
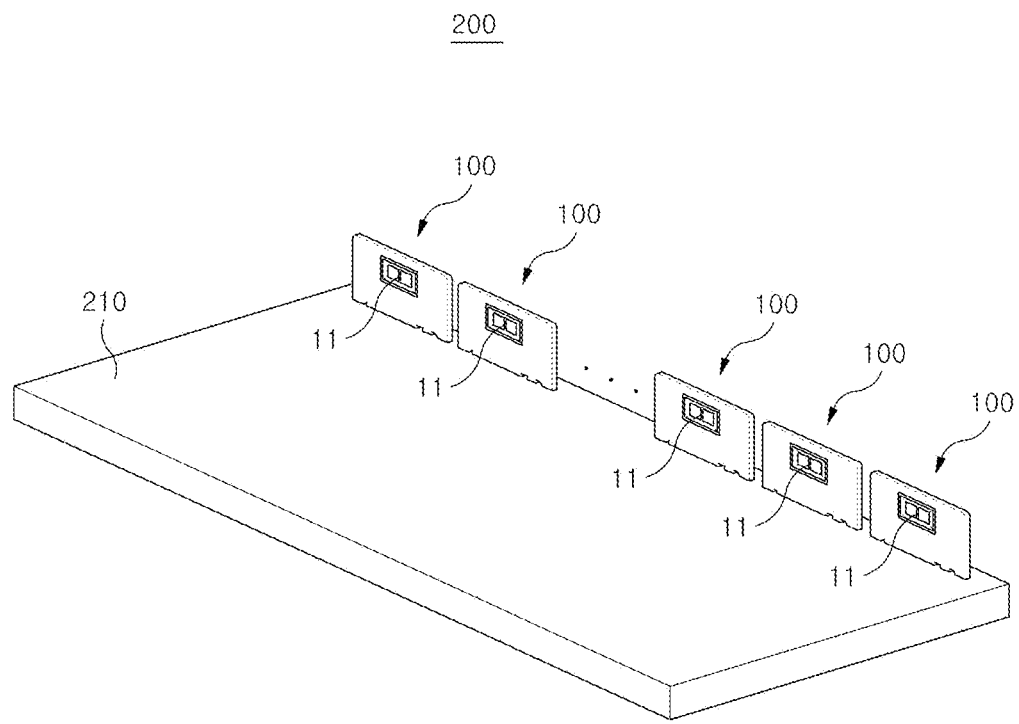
FIG. 7 is a view illustrating an example in which the light emitting device package according to an exemplary embodiment of the present invention is used in a backlight assembly type light emitting device package module.

Hereinafter, a light emitting device package module including the light emitting device package described with reference to FIGS. 1 to 6 will be described. FIG. 7 is a view illustrating an example in which the light emitting device package 100 according to an exemplary embodiment of the present invention is used in a backlight assembly type light emitting device package module 200, and FIG. 8 is a cross-sectional view of a backlight assembly type light emitting device package module 200 according to another exemplary embodiment of the present invention.

Figure 8:
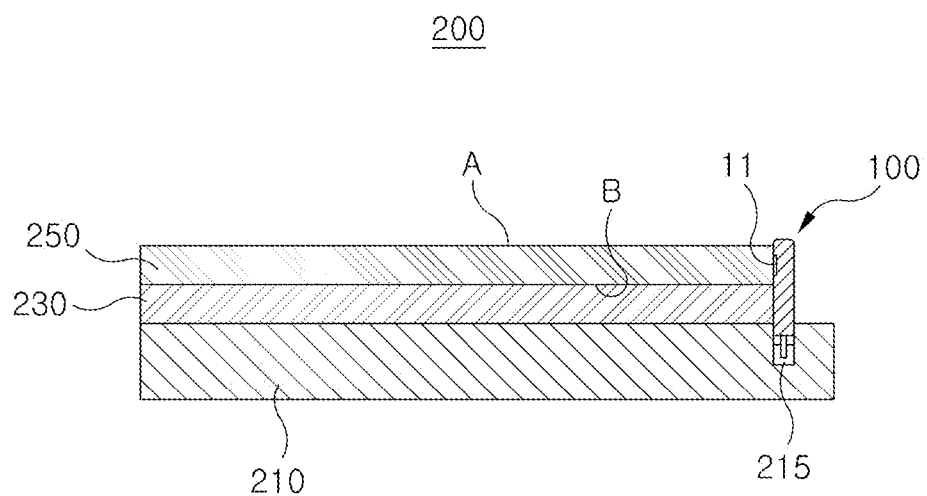
FIG. 8 is a cross-sectional view of a light emitting device package module according to another exemplary embodiment of the present invention.

As illustrated in FIGS. 7 and 8, the light emitting device package module 200 may be configured to include light emitting device packages 100, a circuit board 210, a reflective sheet 230, and a light guide plate 250.

The circuit board 210 may have a predetermined circuit wiring formed thereon. That is, the circuit board 210 may include a plurality of resistor elements and a plurality of circuit portions. A plurality of power providing terminals 215 for supplying power to the light emitting device packages 100 are disposed at predetermined intervals on a side surface of the circuit board 210. The terminals 40 for power supply of the light emitting device packages 100 are vertically coupled to the power providing terminals 215 formed on one side of the circuit board 210, such that a plurality of light emitting device packages 100 are vertically disposed at predetermined intervals, as illustrated in FIG. 7. Therefore, irradiated light of the light emitting device packages 100 is irradiated in parallel with the circuit board 210.

Here, the cavities 11 of the light emitting device packages 100 are positioned at central portions of a side surface of the light guide plate 250 to form the same spacing intervals from a top A and a bottom B of the light guide plate 250. Through the configuration described above, light irradiated from the cavities 11 of the light emitting device package 100 is efficiently induced to the light guide plate 250.

The reflective sheet 230 serves to reflect light from the light emitting device packages 100 to increase an amount of light moving to the light guide plate 250. The light guide plate 250 is disposed on the reflective sheet 230 to serve to transfer light generated in the light emitting device packages 100 to a display panel.

A liquid crystal panel may be disposed on the light emitting device package module configured as described above to constitute a display unit. The display unit including the light emitting device package module as described above has excellent color reproducibility, and may be produced at a cheap cost.

Hereinafter, a light emitting device package 100 according to another exemplary embodiment of the present invention will be described with reference to FIG. 9.

Figure 9:
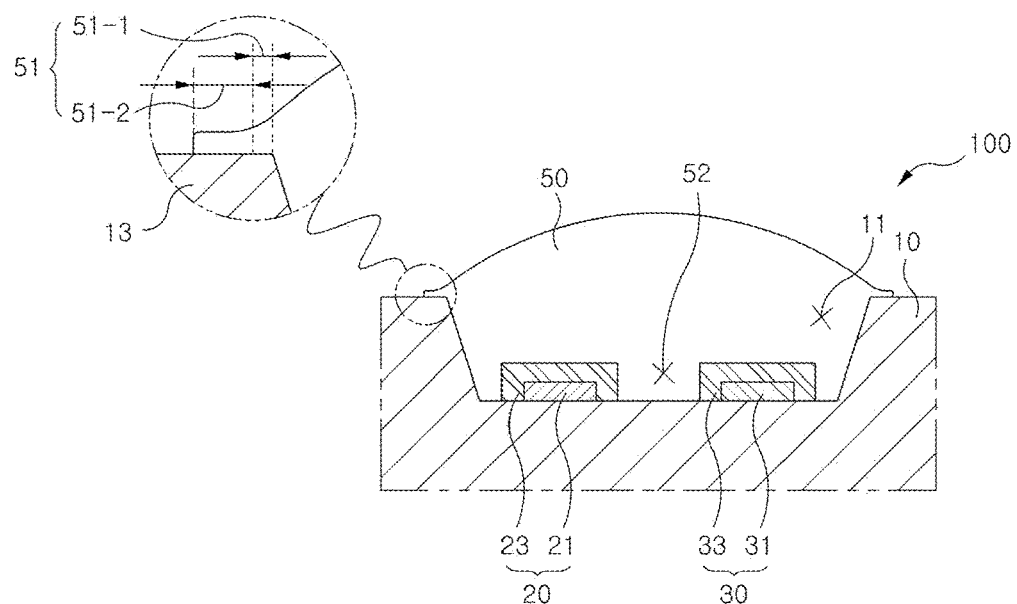
FIG. 9 is a cross-sectional view of a light emitting device package according to still another exemplary embodiment of the present invention.

FIG. 9 is a cross-sectional view of a light emitting device package 100 according to another exemplary embodiment of the present invention. A description for components that are the same as those of the light emitting device package described above in the light emitting device package illustrated in FIG. 9 will be omitted for simplification of explanation. As illustrated in FIG. 9, the molding member 50 is formed to completely cover the cavity 11 in order to increase durability against moisture. The cavity 11 is completely covered, such that an edge of the molding member 50 covers a portion of a top of a dam 13 of the base 10. The edge of the molding member 50 is defined as a sealing portion 51. The sealing portion 51 includes a slope profile 51-1 and a flat profile 51-2, as illustrated. The slope profile 51-1 is a region extended from a central portion of the molding member 50 and having a predetermined gradient in a side surface direction, and the flat profile 51-2 is a region extended from the slope profile 51-1 and having a gradient of substantially 0.

As described above, the sealing portion 51 is configured to have the flat profile 51-2, thereby making it possible to alleviate a peel-off phenomenon that may occur at an upper portion of the dam 13 and the sealing portion 51. That is, since a moisture penetration path between the sealing portion 51 the dam 13 is elongated, even though moisture penetrates through a space between the dam 13 and the sealing portion 51, the moisture penetrates into only a region range of the flat profile 51-2, such that only the flat profile 51-2 is peeled off and the slope profile 51-1 is maintained in a normal adhesion state. That is, since the slope profile 51-1 is formed at a relatively thick thickness, adhesion force by gravity may be larger than peel-off force, such that an additional peel-off phenomenon may be prevented.

In addition, since the flat profile 51-2 is applied at a relatively thin thickness and has a gradient of substantially 0, moisture condensed in the slope profile 51-1 naturally flows outwardly of the dam 13. Therefore, a phenomenon that the moisture is condensed between an end of the flat profile 51-2 and the dam 13 may be prevented.

According to an exemplary embodiment of the present invention having the configuration described above, a twin type package module that does not have the intermediate wall is configured using the light emitting devices formed integrally with the fluorescent layers, thereby making it possible to prevent a flooding phenomenon.

In addition, according to an exemplary embodiment of the present invention, the light emitting device package module irradiating three primary colors is configured through different kinds of light emitting devices, thereby making it possible to implement a high level of color reproducibility at a low cost.

Next, in the case in which a plurality of light emitting elements are mounted in parallel with each other in one package, a size of the package should be increased by changing designs of an existing package and lead frame. Therefore, there was a problem that a single specification package may not be generally used in various product groups. A solution to this problem will be described with reference to FIGS. 10 to 22.

Figure 10:
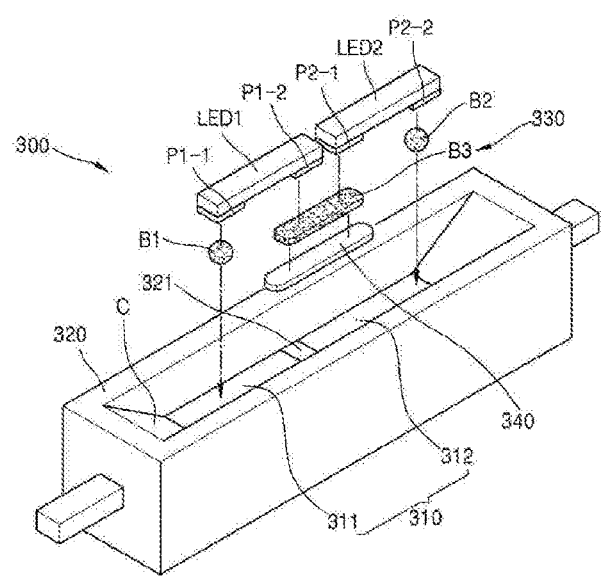
FIG. 10 is an exploded perspective view illustrating a light emitting device package according to some exemplary embodiments of the present invention.

FIG. 10 is an exploded perspective view illustrating a light emitting device package 300 according to some exemplary embodiments of the present invention. In addition, FIG. 11 is a cross-sectional view of the light emitting device package 300 of FIG. 10, and FIG. 12 is an enlarged cross-sectional view of a pad connecting member 330 of the light emitting device package 300 of FIG. 11.

Figure 11:
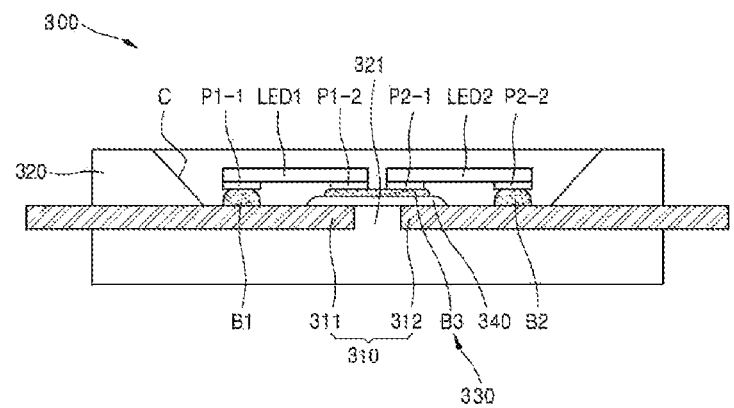
FIG. 11 is a cross-sectional view of the light emitting device package of FIG. 10.
Figure 12:
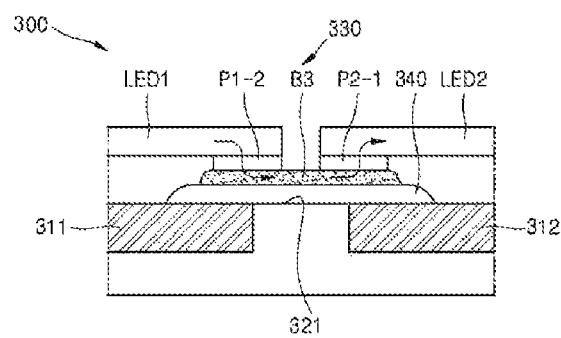
FIG. 12 is an enlarged cross-sectional view of a pad connecting member of the light emitting device package of FIG. 11.

First, as illustrated in FIGS. 10 to 12, the light emitting device package 300 according to some exemplary embodiments of the present invention may include a substrate 310, a reflection encapsulant 320, a first light emitting element LED1, a second light emitting element LED2, and a pad connecting member 330.

For example, as illustrated in FIGS. 10 to 12, the substrate 310 has a first electrode 311 formed at one side thereof on the basis of an electrode separation portion 321 and a second electrode 312 formed at the other side thereof on the basis of the electrode separation portion 321, may mount one or more light emitting devices LED1 and LED2 thereon, is electrically connected to the light emitting devices LED1 and LED2 by the first electrode 311 and the second electrode 312, and may be made of a material having appropriate mechanical strength so as to support the light emitting devices LED1 and LED2. Here, the number of electrode separation portions 321 in the substrate 310 is one, and one light emitting element may be mounted on the substrate 310 or a plurality of light emitting elements such as two, three, four or more light emitting elements, or the like, may be mounted in a series form on the substrate 310, as needed.

In more detail, for example, as illustrated in FIGS. 10 to 12, metal substrates made of aluminum, copper, zinc, tin, lead, gold, silver, or the like, and having a plate form or a lead frame form may be used as the substrate 310. In addition, the substrate 310 may be a printed circuit board (PCB) on which a wiring layer is formed or a flexible printed circuit board (FPCB) made of a flexible material, or may contain a metal and partially contain a resin, a synthetic resin such as glass epoxy, or the like, or a ceramic material in consideration of thermal conductivity, and may contain one or more materials selected from the group consisting of an epoxy molding compound (EMC), polyimide (PI), graphene, and glass fiber in order to improve workability.

In addition, for example, as illustrated in FIGS. 10 to 12, the reflection encapsulant 320 may be molded on the substrate 310 using a mold, has a reflection cup portion C formed in a top thereof so as to accommodate the light emitting elements LED1 and LED2 therein, and may contain a reflection molding member made of a resin material filled in the electrode separation portion 321. In more detail, for example, the reflection encapsulant 320 may be made of an epoxy resin composition, a silicon resin composition, a modified epoxy resin composition, a modified silicon resin composition, a polyimide resin composition, a modified polyimide resin composition, polyphthalamide (PPA), a polycarbonate resin, polyphenylene sulfide (PPS), a liquid crystal polymer (LCP), an acrylonitrile butadiene styrene (ABS) resin, a phenol resin, an acrylic resin, a polybutyrene terephthalate (PBT) resin, an epoxy molding compound containing a reflection material, white silicon containing a reflection material, a photo-imageable solder resistor (PSR), or the like, and these resins may contain a light reflective material such as titanium oxide, silicon dioxide, titanium dioxide, zirconium dioxide, potassium titanate, alumina, aluminum nitride, boron nitride, mullite, chromium, a white based or metal based component, or the like.

In addition, for example, as illustrated in FIGS. 10 to 12, the first light emitting element LED1 is a flip-chip type light emitting diode (LED) in which a first pad P1-1 and a second pad P1-2 are formed on a bottom and the first pad P1-1 is electrically connected to the first electrode 311 on the substrate 310.

In addition, for example, as illustrated in FIGS. 10 to 12, the second light emitting element LED2 is a flip-chip type light emitting diode (LED) in which a third pad P2-1 and a fourth pad P2-2 are formed on a bottom and the fourth pad P2-2 is electrically connected to the second electrode 312 on the substrate 310.

Here, the first light emitting element LED1 and the second light emitting element LED2 described above may be any one of a blue LED, a red LED, and a green LED generating light having the same wavelength or be any one of a blue LED, a red LED, and a green LED generating light having different wavelengths. In addition, the first light emitting element LED1 and the second light emitting element LED2 may be an LED generating light having various wavelengths or a UV LED. However, the first light emitting element LED1 and the second light emitting element LED2 are not necessarily limited thereto. That is, various horizontal type or vertical type LEDs or various types of light emitting elements on which signal transfer medias such as various bumps, wires, solders, or the like, are disposed may be used as the first light emitting element LED1 and the second light emitting element LED2.

In addition, for example, the first light emitting element LED1 and the second light emitting element LED2, which are formed of a semiconductor, may be configured by epitaxially growing a nitride semiconductor such as InN, AlN, InGaN, AlGaN, InGaAlN, and the like, on a sapphire substrate or a silicon carbide substrate for growth by a vapor growth method such as a metal organic chemical vapor deposition (MOCVD) method, or the like. In addition, the first light emitting element LED1 and the second light emitting element LED2 may be formed using semiconductors such as ZnO, ZnS, ZnSe, SiC, GaP, GaAlAs, AlInGaP, and the like, in addition to the nitride semiconductor. As these semiconductors, laminates in which an n-type semiconductor layer, a light emitting layer, and a p-type semiconductor layer are sequentially stacked may be used. As the light emitting layer (active layer), a multilayer semiconductor having a multi-quantum well structure or a single quantum well structure or a multilayer semiconductor having a double hetero structure may be used. In addition, as the first light emitting element LED1 and the second light emitting element LED2, a light emitting element having any wavelength may be selected according to an application such as a display application, an illumination application, or the like.

In addition, for example, as illustrated in FIGS. 10 to 12, the pad connecting member 330 may be a member that may serve as a kind of intermediate electrode body disposed on the electrode separation portion 321 so that the second pad P1-2 of the first light emitting element LED1 and the third pad P2-1 of the second light emitting element LED2 are electrically connected to each other.

In more detail, for example, as illustrated in FIGS. 10 to 12, a first bonding medium B1 made of a conductive material is disposed between the first pad P1-1 and the first electrode 311, a second bonding medium B2 made of a conductive material is disposed between the fourth pad P2-2 and the second electrode 312, and the pad connecting member 330 may include a third bonding medium B3 having one surface contacting the second pad P1-2 of the first light emitting element LED1 and the other surface contacting the third pad P2-1 of the second light emitting element LED2 so that the first light emitting element LED1 and the second light emitting element LED2 may be connected to each other in series and made of a conductive material.

Here, the first bonding medium B1, the second bonding medium B2, and the third bonding medium B3 may contain a solder component, for example, a solder component hardened after a volatile component is volatilized in a solder paste, and may be materials that are the same as each other. However, all of various conductive bonding media containing components such as gold, silver, copper, aluminum, and the like, in addition to the solder component may be used as the first bonding medium B1, the second bonding medium B2, and the third bonding medium B3, and at least one of the first bonding medium B1, the second bonding medium B2, and the third bonding medium B3 may be different from the others thereof.

In addition, as illustrated in FIGS. 10 to 12, an insulating layer 340 may be disposed between the third bonding medium B1 and the first electrode 311 and between the third bonding medium B3 and the second electrode 312.

Here, as illustrated in FIGS. 10 to 12, the insulating layer 340 may be disposed to be put on a portion of a top of the first electrode 311, a top of the electrode separation portion 321, and a portion of a top of the second electrode 312, and may have a width larger than that of the electrode separation portion 321. In addition, the third bonding medium B3 may be formed on the insulating layer 340, and a width of the insulating layer 340 may be larger than that of the third bonding medium B3.

Further, the insulating layer 340 may be partially applied to portions except for a portion of the top of the first electrode 311 and a portion of the top of the second electrode 312 to which the first bonding medium B1 and the second bonding medium B2 are to be applied.

Therefore, as illustrated in FIG. 12, the insulating layer 340 may be stacked on the first electrode 311, the electrode separation portion 321, and the second electrode 312, the third bonding medium B3 may be stacked on the insulating layer 340, the second pad P1-2 of the first light emitting element LED1 may be seated on a portion of the third bonding medium B3, the third pad P2-1 of the second light emitting element LED2 may be seated on the other portion of the third bonding medium B3, and the first light emitting element LED1 and the second light emitting element LED2 may be connected to each other in series when electricity is applied to the first electrode 311 and the second electrode 312.

An arrow of FIG. 12 indicates a flow of electricity when the first light emitting element LED1 and the second light emitting element LED2 are connected to each other in series. As illustrated in FIG. 12, for example, the electricity may flow from the first light emitting element LED1 to the third bonding medium B3 through the second pad P1-2, and flow from the third bonding medium B3 to the third pad P2-1 of the second light emitting element LED2. Here, the third bonding medium B3 may be insulated from the first electrode 311 and the second electrode 312 by the insulating layer 340. Therefore, the first light emitting element LED1 and the second light emitting element LED2 may be connected to each other in series without a short-circuit between the third bonding medium B3 and the first and second electrodes 311 and 312.

Although the case in which two light emitting elements, that is, the first light emitting element LED1 and the second light emitting element LED2 are connected to each other in series in the light emitting device package 300 according to some exemplary embodiments of the present invention illustrated in FIGS. 10 to 12 has been described by way of example, the spirit of the present invention is not necessarily limited thereto. That is, a plurality of light emitting elements such as three light emitting elements, four light emitting elements, five light emitting elements, six or more light emitting elements, or the like, may also be connected to each other in series by additionally disposing the insulating layer 340 on the top of the first electrode 311 or the second electrode 213 and additionally disposing the third bonding medium B3.

Therefore, since a plurality of chips may be connected to each other in series and mounted in an ultra-thin package designed for a single chip, if necessary, by using the pad connecting member 300, a design change is not required, a product having a high amount of light may become ultra-thin, a separate additional design is not required, such that generality of a product may be increased. Accordingly, productivity and performance of the product may be significantly increased.

Figure 13:
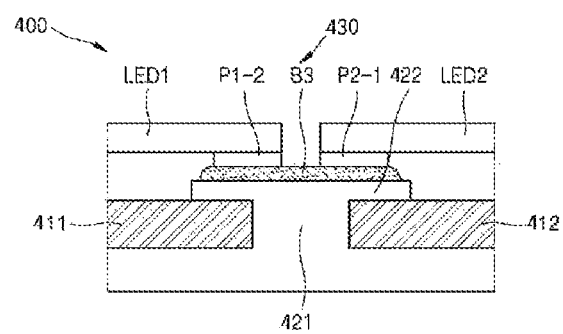
FIG. 13 is an enlarged cross-sectional view illustrating a light emitting device package according to some other exemplary embodiments of the present invention.

FIG. 13 is an enlarged cross-sectional view illustrating a light emitting device package 400 according to some other exemplary embodiments of the present invention.

As illustrated in FIG. 13, in the light emitting device package 400 according to some other exemplary embodiments of the present invention, an electrode separation extension portion 422 of which a width is extended may be disposed on the electrode separation portion 421, instead of the insulating layer 340 illustrated in FIG. 12.

The electrode separation extension portion 422 may be made of the same material as that of the electrode separation portion 421, may be formed integrally with the electrode separation portion 421, and may be molded simultaneously with the electrode separation portion 421 at the time of molding the reflection encapsulant 420.

Therefore, the third bonding medium B3 may be insulated from the first electrode 411 and the second electrode 412 by the electrode separation extension portion 422. Therefore, the first light emitting element LED1 and the second light emitting element LED2 may be connected to each other in series without a short-circuit between the third bonding medium B3 and the first and second electrodes 411 and 412, and since the electrode separation extension portion 422 is molded by a mold, a form thereof may be more stable.

Figure 14:
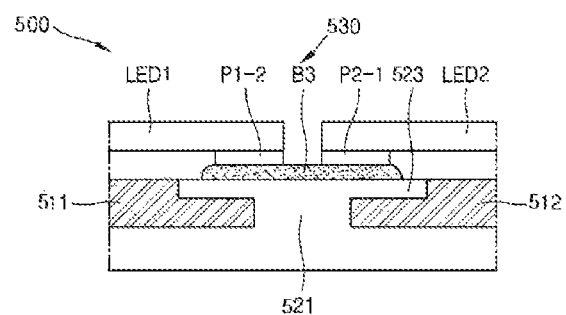
FIG. 14 is an enlarged cross-sectional view illustrating a light emitting device package according to some other exemplary embodiments of the present invention.

FIG. 14 is an enlarged cross-sectional view illustrating a light emitting device package 500 according to some other exemplary embodiments of the present invention.

As illustrated in FIG. 14, in the light emitting device package 500 according to some other exemplary embodiments of the present invention, extension grooves may be formed in the top of the first electrode 511 and the top of the second electrode 512, and an electrode separation extension portion 523 of which a width is extended may be formed in the extension grooves on the electrode separation portion 521, instead of the insulating layer 340 illustrated in FIG. 12.

The electrode separation extension portion 523 may be made of the same material as that of the electrode separation portion 521, may be formed integrally with the electrode separation portion 521, and may be molded simultaneously with the electrode separation portion 521 at the time of molding the reflection encapsulant 520.

Therefore, the third bonding medium B3 may be insulated from the first electrode 511 and the second electrode 512 by the electrode separation extension portion 523. Therefore, the first light emitting element LED1 and the second light emitting element LED2 may be connected to each other in series without a short-circuit between the third bonding medium B3 and the first and second electrodes 511 and 512, and a height of the package may be decreased.

Figure 15:
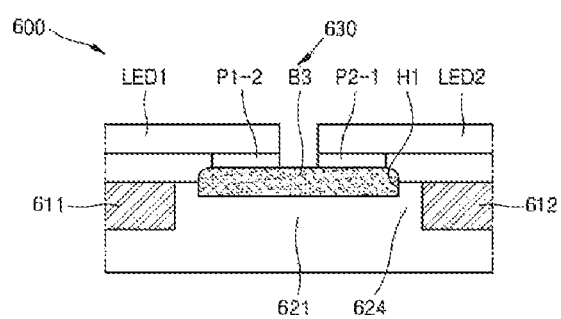
FIG. 15 is an enlarged cross-sectional view illustrating a light emitting device package according to some other exemplary embodiments of the present invention.

FIG. 15 is an enlarged cross-sectional view illustrating a light emitting device package 600 according to some other exemplary embodiments of the present invention.

As illustrated in FIG. 15, in the light emitting device package 600 according to some other exemplary embodiments of the present invention, a space between the first electrode 611 and the second electrode 612 may be widened, an electrode separation extension portion 624 of which a width is extended may be formed on the electrode separation portion 621, and a receptacle hole H1 that may accommodate a portion of the third bonding medium B3 therein may be formed in a top of the electrode separation extension portion 624, instead of the insulating layer 340 illustrated in FIG. 12.

The electrode separation extension portion 624 may be made of the same material as that of the electrode separation portion 621, may be formed integrally with the electrode separation portion 621, and may be molded simultaneously with the electrode separation portion 621 at the time of molding the reflection encapsulant 620.

Therefore, the third bonding medium B3 may be insulated from the first electrode 611 and the second electrode 612 by the electrode separation extension portion 624. Therefore, the first light emitting element LED1 and the second light emitting element LED2 may be connected to each other in series without a short-circuit between the third bonding medium B3 and the first and second electrodes 611 and 612, and an applied position of the third bonding medium B3 may be more precisely aligned.

Figure 16:
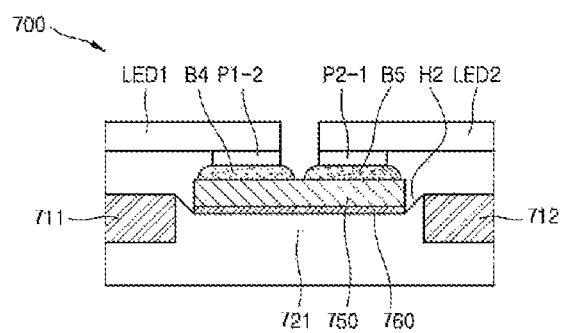
FIG. 16 is an enlarged cross-sectional view illustrating a light emitting device package according to some other exemplary embodiments of the present invention.

FIG. 16 is an enlarged cross-sectional view illustrating a light emitting device package 700 according to some other exemplary embodiments of the present invention.

As illustrated in FIG. 16, a pad connecting member 730 of the light emitting device package 700 according to some other exemplary embodiments of the present invention may be an intermediate electrode 750 accommodated in a receptacle hole H2 formed in the electrode separation portion 721 sufficiently widely formed so as to be insulated from the first electrode 711 and the second electrode 712, electrically connected to the second pad P1-2 of the first light emitting element LED1 by a fourth bonding medium B4, and electrically connected to the third pad P2-1 of the second light emitting element LED2 by a fifth bonding medium B5. Here, the intermediate electrode 750 may be a printed circuit board on which an electrode frame or a wiring layer made of a metal is formed.

In addition, as illustrated in FIG. 16, an adhesive layer 760 may be disposed between the intermediate electrode 750 and the electrode separation portion 721 in order to more firmly fix the intermediate electrode 750 to the electrode separation portion 721.

The receptacle hole H2 of the electrode separation portion 721 may be molded simultaneously with the electrode separation portion 721 at the time of molding the reflection encapsulant 720.

Therefore, the intermediate electrode 750 may be insulated from the first electrode 711 and the second electrode 712 by the electrode separation portion 721, and the intermediate electrode 750 is electrically connected to the second pad P1-2 of the first light emitting element LED1 by the fourth bonding medium B4 and is electrically connected to the third pad P2-1 of the second light emitting element LED2 by the fifth bonding medium B5, such that the first light emitting element LED1 and the second light emitting element LED2 may be connected to each other in series without a short-circuit between the intermediate electrode 750 and the first and second electrodes 711 and 712, and electricity may more stably flow using the intermediate electrode 750.

Here, a width of the intermediate electrode 750 may be smaller than that of the electrode separation portion 721, and be larger than the sum of a width of the second pad P1-2 and a width of the third pad P2-1. In addition, the fourth bonding medium B4 and the fifth bonding medium B5 may be more widely formed integrally with each other.

FIGS. 17 to 20 are cross-sectional views illustrating steps of a process of manufacturing the light emitting device package 300 of FIG. 10.

Figure 17:
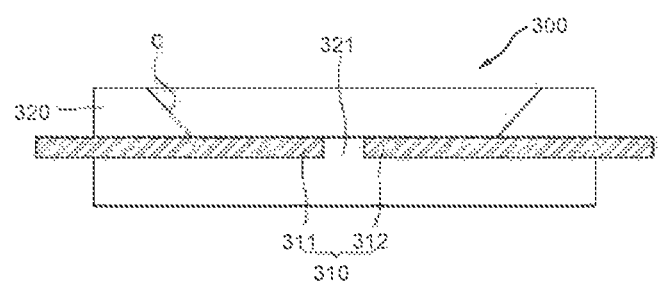
FIGS. 17 to 20 are cross-sectional views illustrating steps of a process of manufacturing the light emitting device package of FIG. 10.

The process of manufacturing the light emitting device package 300 according to some exemplary embodiments of the present invention will be described with reference to FIGS. 17 to 20. First, as illustrated in FIG. 17, the substrate 310 having the first electrode 311 formed at one side thereof on the basis of the electrode separation portion 321 and the second electrode 312 formed at the other side thereof on the basis of the electrode separation portion 321 may be prepared together with the reflection encapsulant 320.

Figure 18:
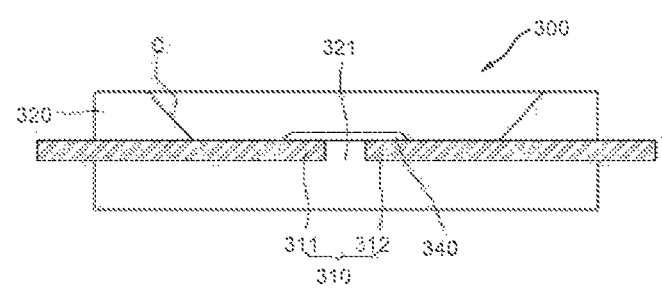

Then, as illustrated in FIG. 18, the insulating layer 340 may be disposed on a portion of the first electrode 311, a top of the electrode separation portion 321, and a portion of the second electrode 312.

Figure 19:
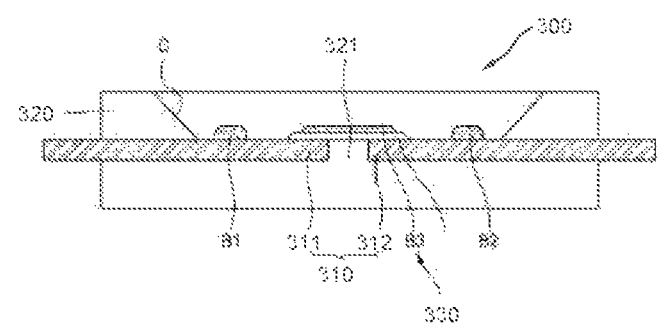

Then, as illustrated in FIG. 19, each of the first bonding medium B1 disposed on the first electrode 311, the second bonding medium B2 disposed on the second electrode 312, and the third bonding medium B2, which is the pad connecting member 330, may be disposed on the insulating layer 340.

Here, the first bonding medium B1, the second bonding medium B2, and the third bonding medium B3 are solder pastes, which are the same material, may be applied onto the insulating layer 340 by various methods such a printing method, a screen-printing method, a dotting method, a dispensing method, and the like. However, the first bonding medium B1, the second bonding medium B2, and the third bonding medium B3 are not necessarily limited to the solder paste, but may be various conductive bonding media such as a silver paste, a gold paste, an aluminum paste, a copper paste, and the like, and at least one of the first bonding medium B1, the second bonding medium B2, and the third bonding medium B3 may be different from the others thereof.

Figure 20:
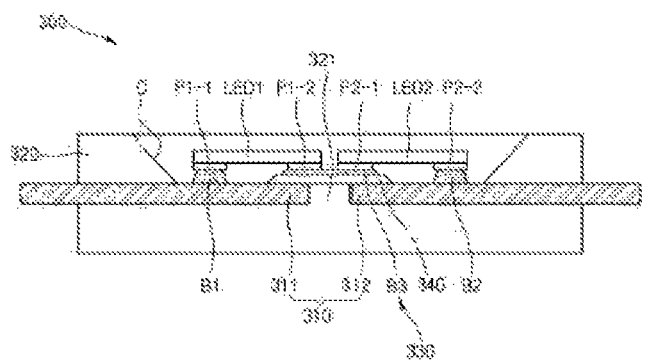

Then, as illustrated in FIG. 20, the first light emitting element LED1 may be seated on the first electrode 311 and the pad connecting member 330 and the second light emitting element LED2 may be seated on the second electrode 312 and the pad connecting member 330 so that the first pad P1-1 of the first light emitting element LED1 is electrically connected to the first electrode 311 of the substrate 310, the fourth pad P2-2 of the second light emitting element LED2 is electrically connected to the second electrode 312 of the substrate 310, and the second pad P1-2 of the first light emitting element LED1 and the third pad P2-1 of the second light emitting element LED2 are electrically connected to each other. Then, the first bonding medium B1, the second bonding medium B2, and the third bonding medium B2 may reflow.

Figure 21:
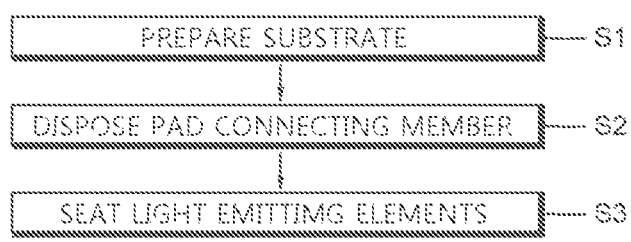
FIG. 21 is a flow chart illustrating a method of manufacturing a light emitting device package according to some exemplary embodiments of the present invention.

FIG. 21 is a flow chart illustrating a method of manufacturing a light emitting device package according to some exemplary embodiments of the present invention.

As illustrated in FIGS. 10 to 21, the method of manufacturing a light emitting device package according to some exemplary embodiments of the present invention may include a substrate preparing step (S1) of preparing the substrate 310 having the first electrode 311 formed at one side thereof on the basis of the electrode separation portion 321 and the second electrode 312 formed at the other side thereof on the basis of the electrode separation portion 321, a pad connecting member disposing step (S2) of disposing the pad connecting member 330 on the electrode separation portion 321, and a light emitting element seating step (S3) of seating the first light emitting element LED1 on the first electrode 311 and the pad connecting member 330 and seating the second light emitting element LED2 on the second electrode 312 and the pad connecting member 330 so that the first pad P1-1 of the first light emitting element LED1 is electrically connected to the first electrode 311 of the substrate 310, the fourth pad P2-2 of the second light emitting element LED2 is electrically connected to the second electrode 312 of the substrate 310, and the second pad P1-2 of the first light emitting element LED1 and the third pad P2-1 of the second light emitting element LED2 are electrically connected to each other.

Here, as illustrated in FIG. 16, in the substrate preparing step (S1), the receptacle hole H2 in which the intermediate electrode 350 may be accommodated may be formed in the electrode separation portion 321, and in the pad connecting member disposing step (S3), the adhesive layer 360 may be applied to the receptacle hole H2 and the intermediate electrode 350 may be disposed on the adhesive layer 360.

Figure 22:
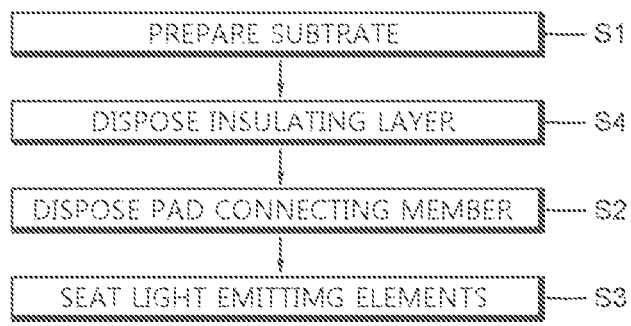
FIG. 22 is a flow chart illustrating a method of manufacturing a light emitting device package according to some other exemplary embodiments of the present invention.

FIG. 22 is a flow chart illustrating a method of manufacturing a light emitting device package according to some other exemplary embodiments of the present invention.

As illustrated in FIG. 22, the method of manufacturing a light emitting device package according to some other exemplary embodiments of the present invention may include a substrate preparing step (S1) of preparing the substrate 310 having the first electrode 311 formed at one side thereof on the basis of the electrode separation portion 321 and the second electrode 312 formed at the other side thereof on the basis of the electrode separation portion 321, an insulating layer disposing step (S4) of disposing the insulating layer 340 on a portion of the first electrode 311 or a portion of the second electrode 312, a pad connecting member disposing step (S2) of disposing the pad connecting member 330 on the electrode separation portion 321, and a light emitting element seating step (S3) of seating the first light emitting element LED1 on the first electrode 311 and the pad connecting member 330 and seating the second light emitting element LED2 on the second electrode 312 and the pad connecting member 330 so that the first pad P1-1 of the first light emitting element LED1 is electrically connected to the first electrode 311 of the substrate 310, the fourth pad P2-2 of the second light emitting element LED2 is electrically connected to the second electrode 312 of the substrate 310, and the second pad P1-2 of the first light emitting element LED1 and the third pad P2-1 of the second light emitting element LED2 are electrically connected to each other.

Here, in the pad connecting member disposing step (S2), the first bonding medium B1 may be disposed on the first electrode 311, the second bonding medium B2 may be disposed on the second electrode 312, and the third bonding medium B3 may be disposed on the insulating layer 340.

Meanwhile, the present invention may include a backlight unit or an illumination apparatus including the light emitting device packages 300, 400, 500, 600, and 700 according to several exemplary embodiments of the present invention described above. Here, configurations and roles of components of the backlight unit or the illumination apparatus according to the present invention may be the same as those of components of the light emitting device packages described above. Therefore, a detailed description for these components will be omitted.

As described above, the light emitting device package and the light emitting device package module including the same may be configured so that the configuration and the method of the exemplary embodiments described above are not restrictively applied, but all or some of the exemplary embodiments may be selectively combined with each other so that various modifications may be made.

What is claimed is:

1. A light emitting device package, comprising:
a substrate including a first electrode, a second electrode, and an electrode separation portion disposed between the first electrode and the second electrode;
a first light emitting device including a first pad and a second pad, the first pad being electrically coupled to the first electrode of the substrate;
a second light emitting device including a third pad and a fourth pad, the fourth pad being electrically coupled to the second electrode of the substrate;

a pad connecting member, the pad connecting member being disposed on the substrate and configured to electrically couple the second pad of the first light emitting device and the third pad of the second light emitting device; and an electrode separation extension portion, wherein the substrate is configured to electrically couple the first light emitting device and the second light emitting device in series via the pad connecting member, and wherein the electrode separation extension portion of which a width is extended is disposed on the electrode separation portion.

2. The light emitting device package of claim 1, wherein the first light emitting device and the second light emitting device each comprise a flip-chip type light emitting diode (LED).

3. The light emitting device package of claim 1, further comprising:

a first conductive bonding material disposed between the first electrode of the substrate and the first pad of the first light emitting device; and a second conductive bonding material disposed between the second electrode of the substrate and the fourth pad of the second light emitting device.

4. The light emitting device package of claim 1, wherein the pad connecting member comprises a conductive bonding material.

5. The light emitting device package of claim 1, wherein the pad connecting member is disposed on the electrode separation portion of the substrate.

6. The light emitting device package of claim 1, further comprising an adhesive layer disposed between the pad connecting member and the electrode separation portion of the substrate.

7. The light emitting device package of claim 1, wherein the electrode separation portion of the substrate is disposed to separate the first electrode and the second electrode, and portions of the electrode separation portion of the substrate are disposed on portions of the first electrode and the second electrode.

8. The light emitting device package of claim 1, wherein the electrode separation extension portion is made of the same material as that of the electrode separation portion, is formed integrally with the electrode separation portion, and is molded simultaneously with the electrode separation portion at the time of molding a reflection encapsulant of the light emitting device package.

9. The light emitting device package of claim 1, wherein the electrode separation extension portion protrudes from the substrate supporting the first electrode and the second electrode, has a width larger than that of the electrode separation portion.

10. The light emitting device package of claim 1, wherein the first electrode and the second electrode are inserted respectively on both sides of the electrode separation extension portion and the electrode separation portion of the substrate.

11. The light emitting device package of claim 1, further comprising extension grooves, wherein the extension grooves are formed in the top of the first electrode and the top of the second electrode, and the electrode separation extension portion is formed in the extension grooves.

12. The light emitting device package of claim 1, further comprising a receptacle hole formed in a top of the electrode separation extension portion, wherein the receptacle hole accommodates the pad connecting member.

13. A light emitting device package, comprising:

a substrate including a first electrode, a second electrode, and an electrode separation portion disposed between the first electrode and the second electrode;

a first light emitting device including a first pad and a second pad, the first pad being electrically coupled to the first electrode of the substrate;

a second light emitting device including a third pad and a fourth pad, the fourth pad being electrically coupled to the second electrode of the substrate; and a pad connecting member, the pad connecting member being disposed on the substrate and configured to electrically couple the second pad of the first light emitting device and the third pad of the second light emitting device, wherein the substrate is configured to electrically couple the first light emitting device and the second light emitting device in series via the pad connecting member, wherein the pad connecting member is disposed in a receptacle hole on the electrode separation portion of the substrate.

14. The light emitting device package of claim 13, wherein the pad connecting member is including an intermediate electrode, a fourth bonding medium, and a fifth bonding medium, wherein the intermediate electrode is electrically connected to the second pad of the first light emitting element by the fourth bonding medium, and electrically connected to the third pad of the second light emitting element by the fifth bonding medium.

15. The light emitting device package of claim 14, wherein a width of the intermediate electrode is smaller than that of the electrode separation portion, and is larger than the sum of a width of the second pad and a width of the third pad.

* * * * *